(12) United States Patent
Wolff et al.

(10) Patent No.: US 10,135,599 B2
(45) Date of Patent: Nov. 20, 2018

(54) FREQUENCY DOMAIN COMPRESSION FOR FRONTHAUL INTERFACE

(71) Applicant: Nokia Technologies Oy, Espoo (FI)

(72) Inventors: Gunter Wolff, Laupheim (DE); Roy Yang, Buffalo Grove, IL (US)

(73) Assignee: Nokia Technologies Oy, Espoo (FI)

( * ) Notice: Subject to any disclaimer, the term of this patent is extended or adjusted under 35 U.S.C. 154(b) by 53 days.

(21) Appl. No.: 15/229,834

(22) Filed: Aug. 5, 2016

(65) Prior Publication Data

US 2018/0041327 A1 Feb. 8, 2018

(51) Int. Cl.
*H04L 5/14* (2006.01)
*H04L 27/26* (2006.01)
*H04L 29/06* (2006.01)
*H04W 88/08* (2009.01)

(52) U.S. Cl.
CPC ............ *H04L 5/1492* (2013.01); *H04L 27/26* (2013.01); *H04L 27/265* (2013.01); *H04L 27/2628* (2013.01); *H04L 69/22* (2013.01); *H04W 88/085* (2013.01)

(58) Field of Classification Search
CPC ... H04L 69/04; H04L 27/2628; H04L 27/265; H04L 27/2647; H04L 27/2626–27/2636
See application file for complete search history.

(56) References Cited

U.S. PATENT DOCUMENTS

| | | | | |
|---|---|---|---|---|
| 7,028,063 B1* | 4/2006 | Sarmaru | ............... | G06F 17/141 708/403 |
| 2012/0176966 A1* | 7/2012 | Ling | ........................ | H04B 1/40 370/328 |
| 2012/0250740 A1* | 10/2012 | Ling | .................... | H04W 88/085 375/219 |
| 2013/0083768 A1* | 4/2013 | Liu | ...................... | H04L 27/2636 370/330 |
| 2013/0324176 A1* | 12/2013 | Cheng | ..................... | H04W 8/00 455/509 |
| 2015/0163772 A1* | 6/2015 | Ni | ........................ | H04L 27/2626 370/329 |
| 2015/0230120 A1 | 8/2015 | Choi et al. | ........ | H04W 28/0205 |

(Continued)

OTHER PUBLICATIONS

Guo, Bin et al.; "LTE/LTE-A Signal Compression on the CPRI Interface"; Bell Labs Technical Journal, vol. 18, No. 2, 2013; pp. 117-133.

(Continued)

*Primary Examiner* — Asad Nawaz
*Assistant Examiner* — Najeebuddin Ansari
(74) *Attorney, Agent, or Firm* — Harrington & Smith

(57) ABSTRACT

Frequency domain compression of fronthaul interface for transporting frequency domain data over Ethernet includes applying Inverse Discrete Fourier Transform to frequency domain data contained in a frequency bandwidth to generate a time domain output signal in a time domain. The time domain output signal is compressed to generate a compressed time domain output signal. The compressed time domain output signal is transmitted over a fronthaul interface to a remote unit. The compressed time domain output signal is decompressable at the remote unit to generate a decompressed time domain output signal. Discreet Fourier Transform is applied to the decompressed time domain output signal at the remote unit to recover the frequency domain data.

16 Claims, 11 Drawing Sheets

(56) References Cited

U.S. PATENT DOCUMENTS

2015/0348231 A1 12/2015 Jo .............................. G06T 3/40
2015/0365934 A1 12/2015 Liu et al. .......... H04W 72/0413

OTHER PUBLICATIONS

Brubaker, David et al.; "The Emerging Need for Fronthaul Compression"; Altera Corporation; Jun. 2016; 12 pgs.
Checko, Aleksandra et al.; "Cloud RAN for Mobile Networks—A Technology Overview"; IEEE Communications Survey & Tutorials, vol. 17, No. 1, 2014; pp. 405-426.
Hsu, Chau-Yun et al.; "PAPR Reduction Using the Combination of Precoding and Mu-Law Companding Techniques for OFDM Systems"; IEEE $11^{th}$ International Conference on Signal Processing (ICSP), Oct. 2012; 4 pgs.
Shier, William et al.; "DFT-Spread OFDM for Optical Communications"; IEEE $9^{th}$ International Conference on Optical Internet (COIN), Jul. 2010; 3 pgs.

\* cited by examiner

Layer 1 split at the frequency domain boundary for Telco Cloud

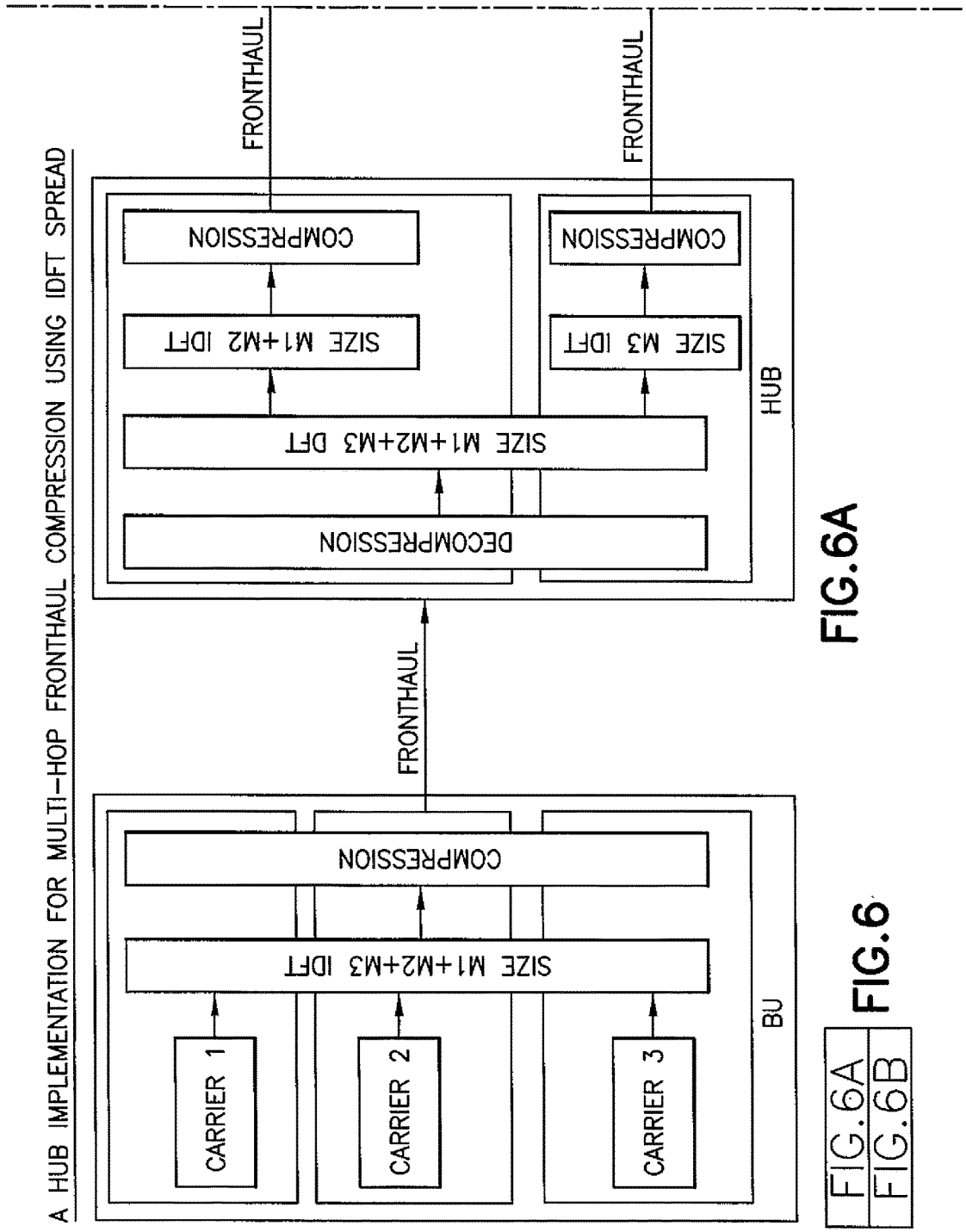

EVM=0.87%

EVM=0.64%

EVM=1.53%

EVM=0.89%

FREQUENCY DOMAIN COMPRESSION FOR FRONTHAUL INTERFACE

TECHNICAL FIELD

This invention relates generally to radio fronthaul interface compression and, more specifically, relates to radio fronthaul interface compression for transporting frequency domain data over Ethernet.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below, after the main part of the detailed description section.

Fronthaul is used to carry baseband data from the baseband units (BBU) to the remote radio units (RRU). The Fronthaul function is to enable the baseband units to seamlessly connect to the remote radio units without impacting radio performance. In modern cellular architecture, baseband units and remote radio units are no longer simple one to one relationship. For example, centralized baseband units can support a plural of remote radio units that are geographically separated. However, for example, it is not economical to run a separate fiber to each radio unit. As a result, baseband data for several radio units that are geographically close to each other (radio unit cluster) can be sent together in a single fiber. Along the same lines, one can use a single fiber to carry baseband data for several radio unit clusters to a geographically neutral location (or a HUB), then split the baseband data to different radio unit clusters in separate fiber cables.

Radio over Ethernet has gained a lot of attention recently due to its cost effectiveness and scaling flexibility. Frequency domain antenna data over Ethernet is now considered the preferred inception point for 5G technology to enter into 3GPP standard for Cloud RAN architecture. 3GPP and other standard bodies like IEEE NGFI WG (Next Generation Fronthaul Interface Work Group—represented by various operator and equipment vendors) are also actively pursuing standardization of radio over Ethernet.

In Nokia's Cloud RAN roadmap, one approach is the so called L1' split, which is transporting frequency domain data over Ethernet, as shown in FIG. 3.

In this architecture, the frequency domain data are transported over the fronthaul to the radio unit (which may or may not be remote), where they are converted to time domain through IFFT, a cyclic prefix is inserted and the signal is sent to the RF block for additional signal processing before going over the air. The fronthaul is the serial connection between baseband controllers and standalone radio heads. The fronthaul length may range, for example, from less than a few meters to 40 or more kilometers. If the radiohead is remote, the baseband controllers are separated from the radio units, but not necessarily geographically far away.

In order to be bandwidth efficient, compression is used on the frequency domain data. One typical compression algorithms is u-law compression. The commonality of compression algorithms is to use a fewer number of bits to represent the original data, which requires a larger number of bits. In order to improve the performance, it is desirable to reduce the dynamic range of the data to be compressed.

However, in the conventional LTE implementation, the dynamic range of the frequency domain signal can vary significantly due to, among others, the following reasons:

(1) For the control channel symbol region of the downlink, the frequency domain power can vary greatly due to power control and non-contiguous resource allocation. In the symbols that carry PDCCH, some REGs (Resource Element Group) can have large values for cell edge users while the neighboring REGs can have much lower value for cell centre users, or certain REGs can be left un-used. The same can be said for PHICH where the dynamic range can be large due to user multiplexing as well as power control.

(2) For the shared user traffic region of the downlink, the dynamic range of the frequency domain power can also be large due to precoding and to a lesser degree, due to higher order modulation (for example, QAM256).

(3) Any pilot boosting on the downlink can affect the dynamic range of the frequency domain data for compression. In addition, in 3GPP 5G preliminary specification (5G_211, 5G_213), a new concept of downlink power boosting is proposed. This power boosting method suggests increasing the downlink power over the resource blocks (RBs) for cell edge users while reducing the downlink power over the resource blocks for near users.

As an example of reducing PAPR, Uplink SC-OFDM for LTE utilizes SC-OFDM in LTE to reduce the PAPR for power saving purposes. But this SC-OFDM is on a per-UE basis, and is only used on portions of PUSCH Resource Blocks.

As an example of frequency domain conversion, methods are known that apply FFT to time domain signals to convert it to frequency domain, and transport the frequency domain data over the fronthaul interface. In this case, FFT is applied to the entire signal.

In summary, it is typically not optimal to do block compression/decompression on the frequency domain data directly due to the large dynamic range in the data block. Accordingly, there is a need to reduce the dynamic range in order to improve the compression/decompression performance.

BRIEF SUMMARY

This section is intended to include examples and is not intended to be limiting.

In accordance with an exemplary embodiment, a method includes applying Inverse Discrete Fourier Transform (IDFT) to frequency domain data contained in a frequency bandwidth to generate a time domain output signal in a time domain. The time domain output signal is compressed to generate a compressed time domain output signal. The compressed time domain output signal is transmitted over a fronthaul interface to a remote unit. The compressed time domain output signal is decompressable at the remote unit to generate a decompressed time domain output signal. Discreet Fourier Transform (DFT) is applied to the decompressed time domain output signal at the remote unit to recover the frequency domain data.

In accordance with another exemplary embodiment, a method includes receiving a compressed time domain output signal. The compressed time domain output signal is generated by applying IDFT to frequency domain data contained in a frequency bandwidth to generate a time domain output signal in a time domain, and compressing the time domain output signal. The compressed time domain output signal is decompressed, and DFT applied to the decompressed time domain output signal to recover the frequency domain data.

In accordance with another exemplary embodiment, an apparatus comprises: at least one processor; and at least one memory including computer program code, the at least one memory and the computer program code configured to, with the at least one processor, cause the apparatus to perform at least the following: apply Inverse Discrete Fourier Transform to frequency domain data contained in a frequency bandwidth to generate a time domain output signal in a time domain; compress the time domain output signal to generate a compressed time domain output signal; transmit the compressed time domain output signal over a fronthaul interface to a remote unit, where the compressed time domain output signal is decompressable at the remote unit to generate a decompressed time domain output signal, and where applying Discreet Fourier Transform to the decompressed time domain output signal at the remote unit recovers the frequency domain data.

In accordance with another exemplary embodiment, a computer program product comprises a computer-readable medium bearing computer program code embodied therein for use with a computer, the computer program code comprising: code for applying Inverse Discrete Fourier Transform to frequency domain data contained in a frequency bandwidth to generate a time domain output signal in a time domain; code for compressing the time domain output signal to generate a compressed time domain output signal; code for transmitting the compressed time domain output signal over a fronthaul interface to a remote unit, where the compressed time domain output signal is decompressable at the remote unit to generate a decompressed time domain output signal, and where applying Discreet Fourier Transform to the decompressed time domain output signal at the remote unit recovers the frequency domain data.

In accordance with another exemplary embodiment, an apparatus comprises at least one processor; and at least one memory including computer program code, the at least one memory and the computer program code configured to, with the at least one processor, cause the apparatus to perform at least the following: receive a compressed time domain output signal, where the compressed time domain output signal is generated by applying Inverse Discrete Fourier Transform to frequency domain data contained in a frequency bandwidth to generate a time domain output signal in a time domain, and compressing the time domain output signal; decompress the compressed time domain output signal; and apply Discreet Fourier Transform to the decompressed time domain output signal to recover the frequency domain data.

In accordance with another exemplary embodiment, a computer program product comprises a computer-readable medium bearing computer program code embodied therein for use with a computer, the computer program code comprising: code for receiving a compressed time domain output signal, where the compressed time domain output signal is generated by applying Inverse Discrete Fourier Transform to frequency domain data contained in a frequency bandwidth to generate a time domain output signal in a time domain, and compressing the time domain output signal; code for decompressing the compressed time domain output signal; and code for applying Discreet Fourier Transform to the decompressed time domain output signal to recover the frequency domain data.

BRIEF DESCRIPTION OF THE DRAWINGS

In the attached Drawing figures:

FIG. 5, which includes

FIG. 6, which includes FIGS. 6A and 6B, illustrates a HUB implementation for multi-hop fronthaul compression using IDFT spread;

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments herein describe techniques for frequency domain compression for a fronthaul interface. Additional description of these techniques is presented after a system into which the exemplary embodiments may be used is described.

Figure 1:
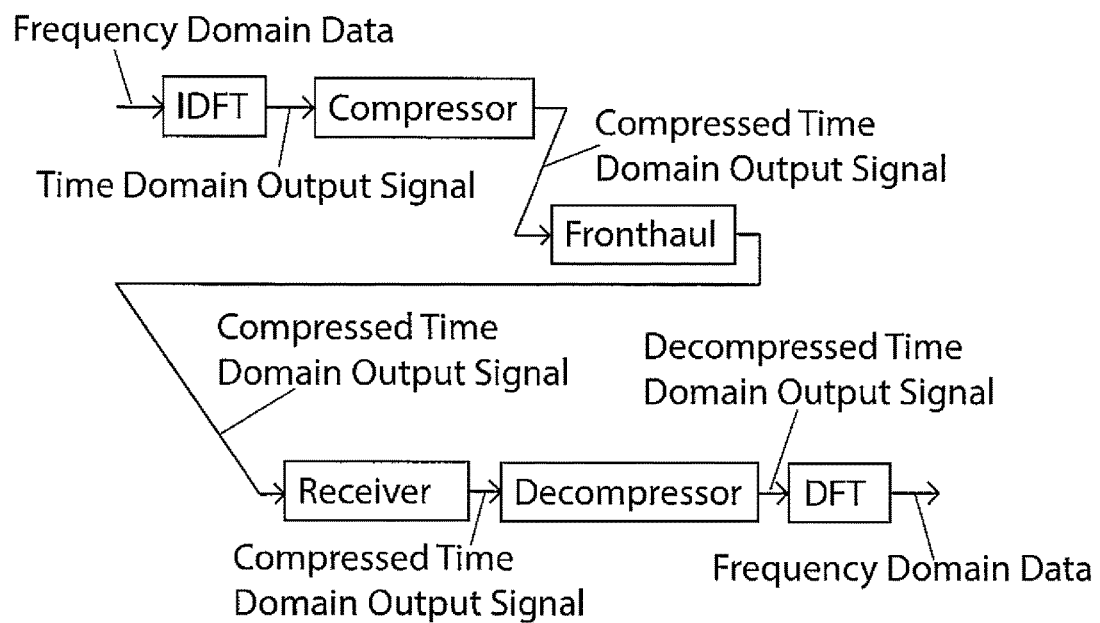
FIG. 1 is a block diagram of one possible and non-limiting exemplary system in which the exemplary embodiments may be practiced.

Turning to FIG. 1, this figure shows a block diagram of one possible and non-limiting exemplary system in which the exemplary embodiments may be practiced.

FIG. 1 is a block diagram of an exemplary embodiment of the frequency domain compression of a fronthaul interface for transporting frequency domain data over, for example, Ethernet. Ethernet is one example of data protocols running on the fronthaul, however, it is also possible to use an extension of CPRI or OBSAI protocol to transport antenna signal after the IDFT spread. In the case of the use of an Ethernet fronthaul interface, additional requirements such as high data rate, low delay, small protocol overhead and very precise clock may need to be considered.

Block IDFT applies IDFT to Frequency Domain Data contained in a frequency bandwidth to generate a Time Domain Output Signal in a time domain. The Time domain Output Signal is compressed by Block Compressor to generate a Compressed Time Domain Output Signal. The Compressed Time Domain Output Signal is transmitted over Block Fronthaul interface to a remote unit (not shown) that includes Block Receiver. The Compressed Time Domain Output Signal is received at the remote unit to generate a Decompressed Time Domain Output Signal. Block DFT applies DFT to the Decompressed Time Domain Output Signal at the remote unit to recover the Frequency Domain Data.

The components of the Blocks shown in FIG. 1 may include one or more processors, one or more memories, and one or more transceivers interconnected through one or more buses. The one or more buses may be address, data, or control buses, and may include any interconnection mechanism, such as a series of lines on a motherbbard or integrated circuit, standard twisted pair cables, fiber optics or other optical communication equipment, and the like. The one or more memories can include computer program code. The fronthaul interface may include, for example, an Ethernet, CPRI or OBSAI connection for transmitting the time domain output signal. The fronthaul may use standard or category 5, 6, 6e copper twisted pair cables.

As described in more detail herein, in accordance with the non-limiting exemplary embodiment illustrated in FIG. 1, compression need only be performed on data carried by the data carriers while achieving the goal of reducing the dynamic range for better compression. In order to reduce the dynamic range of the frequency domain signal, IDFT is applied for all the user RBs and control RBs and even un-used RBs before the Block Compressor, that means only one single a IDFT process is needed for all the users of, for example, a base station, over the fronthaul interface. As also described in more detail below, dynamic scaling can be used to maximize the compression dynamic range and performance. Also, by applying IDFT across multiple carriers of multiple cells, one can use a size M1+M2+ . . . Mk IDFT to spread the frequency domain data across multiple carriers before performing compression. This way, one can use IDFT to do "load balancing" across multiple carriers such that lightly loaded cell (for example, one that has unused RBs) can "help" heavily loaded cells by reducing the dynamic range of the heavily loaded cell.

Figure 2A:
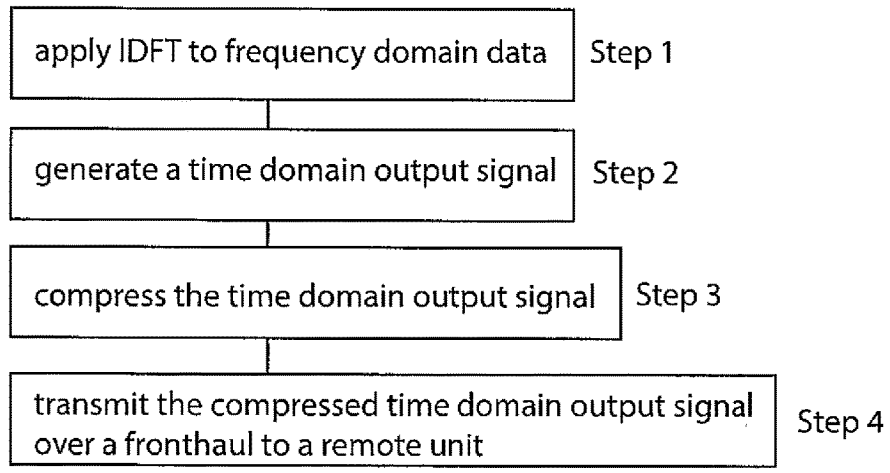
FIGS. 2(a) and 2(b) are logic flow diagrams for frequency domain compression for a fronthaul interface, and illustrate the operation of exemplary methods, a result of execution of computer program instructions embodied on a computer readable memory, functions performed by logic implemented in hardware, and/or interconnected means for performing functions in accordance with exemplary embodiments.

FIG. 2(a) is a logic flow diagram for frequency domain compression for a fronthaul interface. This figure further illustrates the operation of an exemplary method, a result of execution of computer program instructions embodied on a computer readable memory, functions performed by logic implemented in hardware, and/or interconnected means for performing functions in accordance with exemplary embodiments. IDFT is applied to frequency domain data contained in a frequency bandwidth (Step 1) to generate a time domain output signal in a time domain (Step 2). The time domain output signal is compressed to generate a compressed time domain output signal (Step 3). The compressed time domain output signal is transmitted over a fronthaul interface to a remote unit (Step 4). The compressed time domain output signal is decompressable at the remote unit to generate a decompressed time domain output signal. DFT is applied to the decompressed time domain output signal at the remote unit to recover the frequency domain data.

Figure 2B:
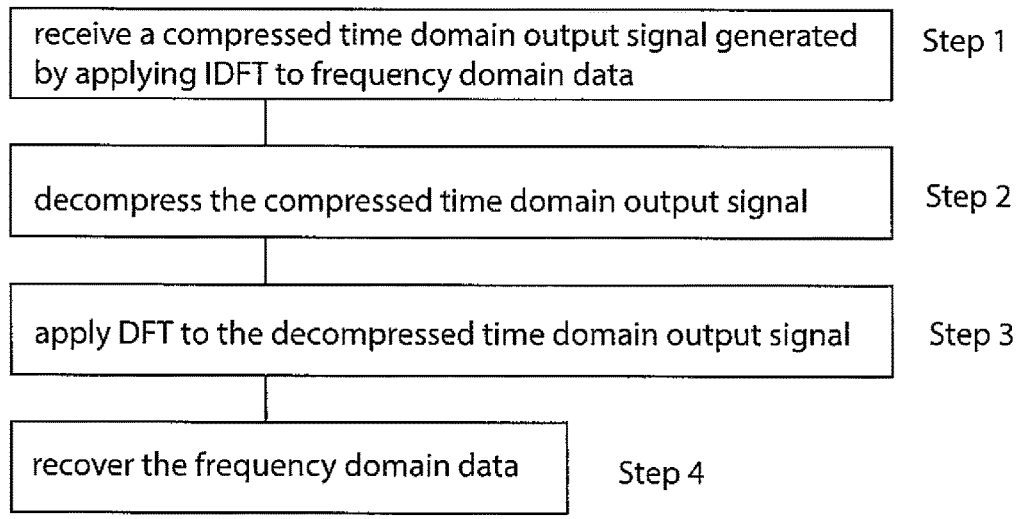
Figure 3:
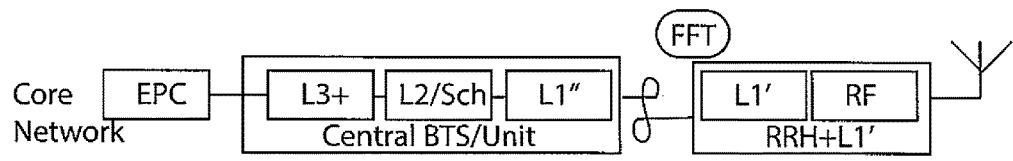
FIG. 3 illustrates a Layer 1 split at the frequency domain boundary for a Telco Cloud.

FIG. 2(b) is a logic flow diagram for frequency domain compression for a fronthaul interface. This figure further illustrates the operation of an exemplary method, a result of execution of computer program instructions embodied on a computer readable memory, functions performed by logic implemented in hardware, and/or interconnected means for performing functions in accordance with exemplary embodiments. A compressed time domain output signal is received, where the compressed time domain output signal is generated by applying IDFT to frequency domain data contained in a frequency bandwidth to generate a time domain output signal in a time domain, and compressing the time domain output signal (Step 1). The compressed time domain output signal is decompressed (Step 2). DFT is applied to the decompressed time domain output signal (Step 3), and the frequency domain data is recovered (Step 4).

To improve the compression/decompression performance, in accordance with an exemplary embodiment, IDFT may be applied to frequency domain data over the entire bandwidth before compression, the compressed data is sent over the fronthaul to the remote unit where after decompression, and DFT is applied to the decompressed data to recover the frequency domain data.

Figure 4:
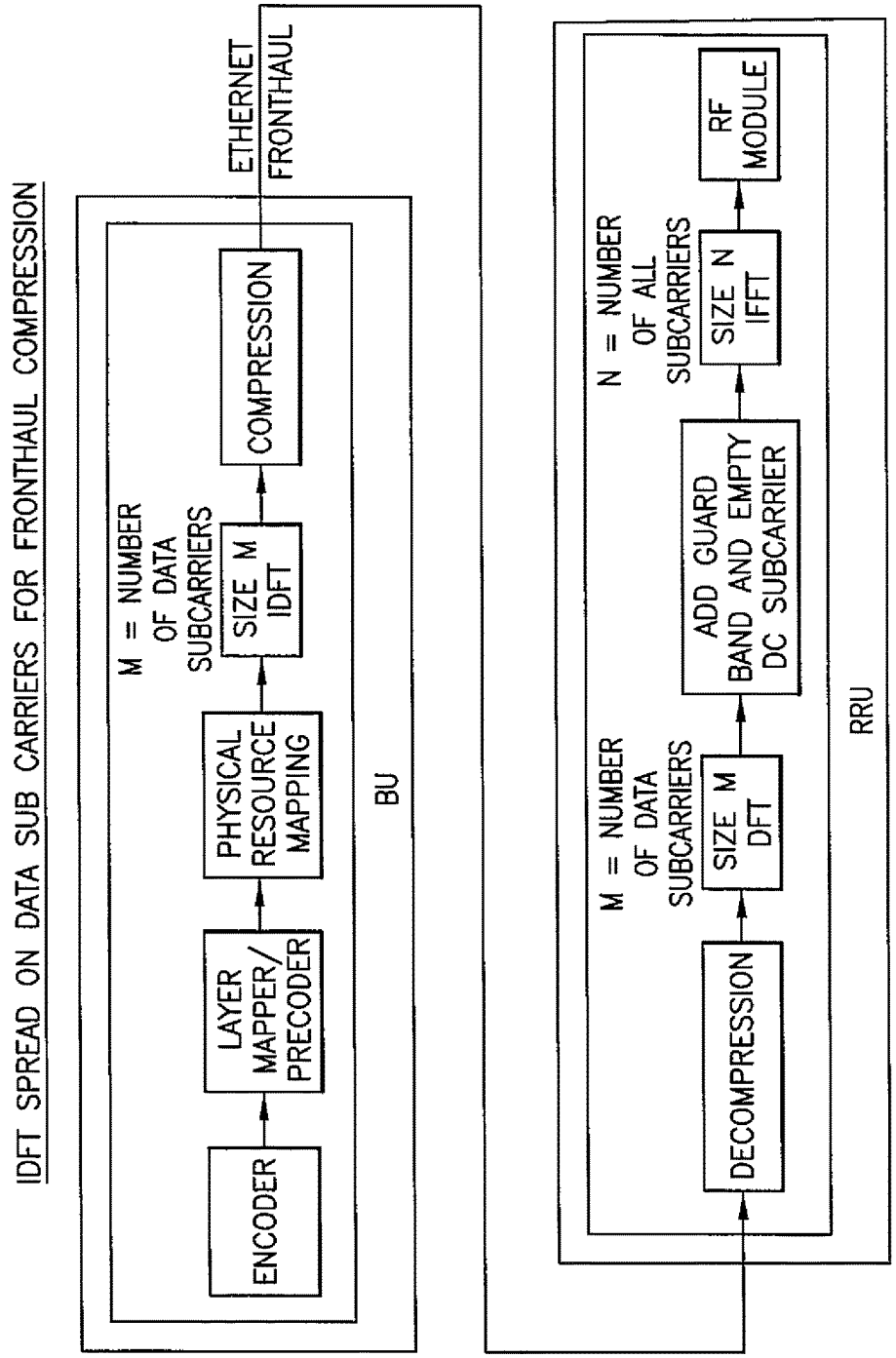
FIG. 4 illustrates IDFT spread on data sub carriers for fronthaul compression.

As shown in FIG. 4, in accordance with an exemplary non-limiting embodiment, as an example, for a 20 MHz frequency bandwidth, there will be 1200 data carriers. Therefore, in accordance with this example of the exemplary embodiment, the IDFT size would be 1200. In contrast, an LTE downlink OFDM signal generated through 2048 FFT includes the entire 2048 carriers (1200 data carriers and 848 null carriers).

After the application of the IDFT to the frequency domain data, the output signal is in the time domain. The frequency domain data may be contained in a frequency bandwidth, and the IDFT may be applied on the frequency domain data over the entire frequency bandwidth. The Inverse Discrete Fourier Transform may be applied on the frequency domain data over the entire frequency bandwidth, with the exception of guard bands and direct current carriers, if present. The dynamic range of the frequency domain data will be reduced, as the subcarriers with larger frequency domain power will be distributed across time intervals of the resulting time domain data. This smaller dynamic range data can then be compressed and sent over the fronthaul. At the remote end of the fronthaul, a remote RF unit (RRU) decompresses the data, and performs 1200 width DFT to recover the frequency domain data.

Subsequently the 1200 frequency domain data will be augmented with a guard band with 847 total null carriers on both sides of the spectrum and one empty DC carrier in the middle, and a full 2048 width IFFT is applied. A cyclic prefix is inserted before the signal is sent to the RF module for transmission over the air.

The guard band, empty DC carrier and cyclic prefix are standard specific extensions of the signal that are included to improve detection of the transmitted signal. They add no information to the signal and may be omitted in fronthaul communication.

As an example, to send a baseband signal wirelessly, the LTE standard specifies that in the remote radio unit:
 (1) Take the recovered 1200 data subcarriers.
 (2) Add guard bands of a total of 847 null subcarriers to both sides of the data subcarriers in the frequency spectrum to form a total of 2048 subcarriers.
 (3) Perform size 2048 EFFT to these 2048 subcarriers to transform the data to the time domain, resulting in 2048 time domain samples.
 (4) Append cyclic prefix, which is either the last 160 or 144 samples of 2048 time domain samples from step (3).

(5) Send these time domain samples sequentially over the air.

However, typically the fronthaul baseband data is not transmitted wirelessly, so the fronthaul does not have to be, for example, compliant with the LTE standard. In accordance with a non-limiting exemplary embodiment, 1200 data sub-carriers are used over the fronthaul interface. Performing size 1200 IDFT will result in 1200 time domain samples, which is much less than the 2048 time domain samples that would be required to perform IDFT over the entire data plus null subcarriers, thus conserving bandwidth over the fronthaul.

The fronthaul can be a network that connects remote radios with centralized baseband units. Aside from the existing centralized network architecture, this fronthaul network is also suitable for 5G Radio Cloud where remote radio heads are connected via Ethernet to the General Purpose Processors (GPP—for example, Intel X86 processors) running virtual machines. The non-limiting exemplary embodiment also applies to sensor networks and cognitive radio, where better compression would be desired to use the fronthaul interface more efficiently.

In accordance with a non-limiting exemplary embodiment, the frequency domain data may be augmented with at least one guard band and one empty DC carrier after decompressing the compressed time domain output signal. A cyclic prefix may be inserted in the compressed time domain output signal before transmitting. The least one guard band may be located at either side of the frequency bandwidth and the empty DC carrier may be located substantially at the middle of the frequency bandwidth.

The amount of dynamic range reduction has to do with the frequency domain data energy distribution. Out of the 1200 data carriers, when there are more lower energy values (with real or imaginary component or both close to the zero axis), or when some data carriers are un-allocated thus having zero energies, the dynamic range reduction can be more significant.

Scaling is applied to the IDFT output to take advantage of the full dynamic range of the compression. The IDFT output contains a real part and an imaginary part. In certain embodiments, the real and imaginary parts may be separately scaled because they may have different dynamic ranges. These dynamic ranges are then scaled to the full dynamic range of the compression scheme via scaling factors before compression is performed. The scaling factors (one for the real part, and one for the imaginary part) are constants and can be sent to the RRU over the fronthaul interface, as in-band transmissions of the compressed time domain output signal, or as out-of-band transmissions, for example, in a packet header field.

At RRU, after decompression is performed on the received data, the inverse of the scaling factors shall be applied to restore the original dynamic range of the real and imaginary part of the data. Finally, DFT is used to recover the frequency domain data.

In accordance with a non-limiting exemplary embodiment, the time domain output signal may contain a real part and an imaginary part. The real part and the imaginary part may be separately scaled. A real part dynamic range of the real part may be different than an imaginary part dynamic range of the imaginary part. A real part scaling factor may be applied to the real part and an imaginary part scaling factor applied to the imaginary part prior to compressing the time domain output signal. The real part scaling factor and the imaginary part scaling factor may be constants transmitted in band as part of the compressed time domain output signal or out-of-band, for example, in a packet header field. After decompressing, an inverse of the real part scaling factor and an inverse of the imaginary scaling factor may be applied to restore the real part dynamic range of the real part and the imaginary part dynamic range of the imaginary part in the recovered frequency domain data.

With a fixed compression ratio, for example, 16 bits to 9 bits, with lowered dynamic range of the input signal, the precision of the compression can be improved. Conversely, with lowered dynamic range of the input signal, one could also increase the compression ratio, for example, use 16 bits to 8 bits compression, and still achieve the targeted performance. As a result, by determining the dynamic range reduction due to IDFT spread, one could adaptively select the compression ratio to meet the performance target and at the same time use the fronthaul efficiently.

In accordance with a non-limiting exemplary embodiment, a dynamic range reduction due to the application of the Inverse Discrete Fourier Transform to frequency domain data may be determined and a compression ratio of the compressed time domain output signal may be selected dependent on the dynamic range reduction.

Figure 5A:
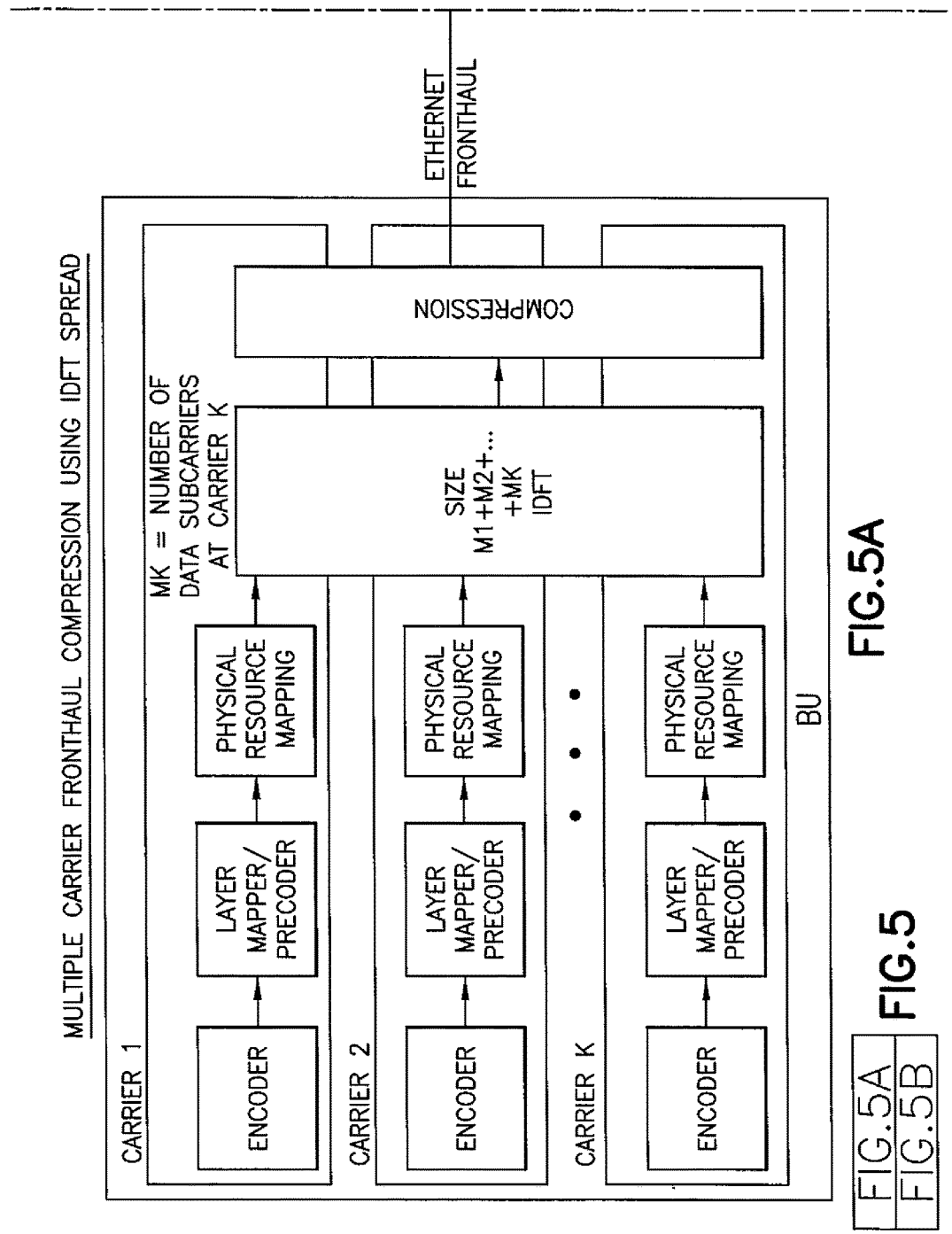
FIGS. 5A and 5B, illustrates multiple carrier fronthaul compression using IDFT spread.
Figure 5B:
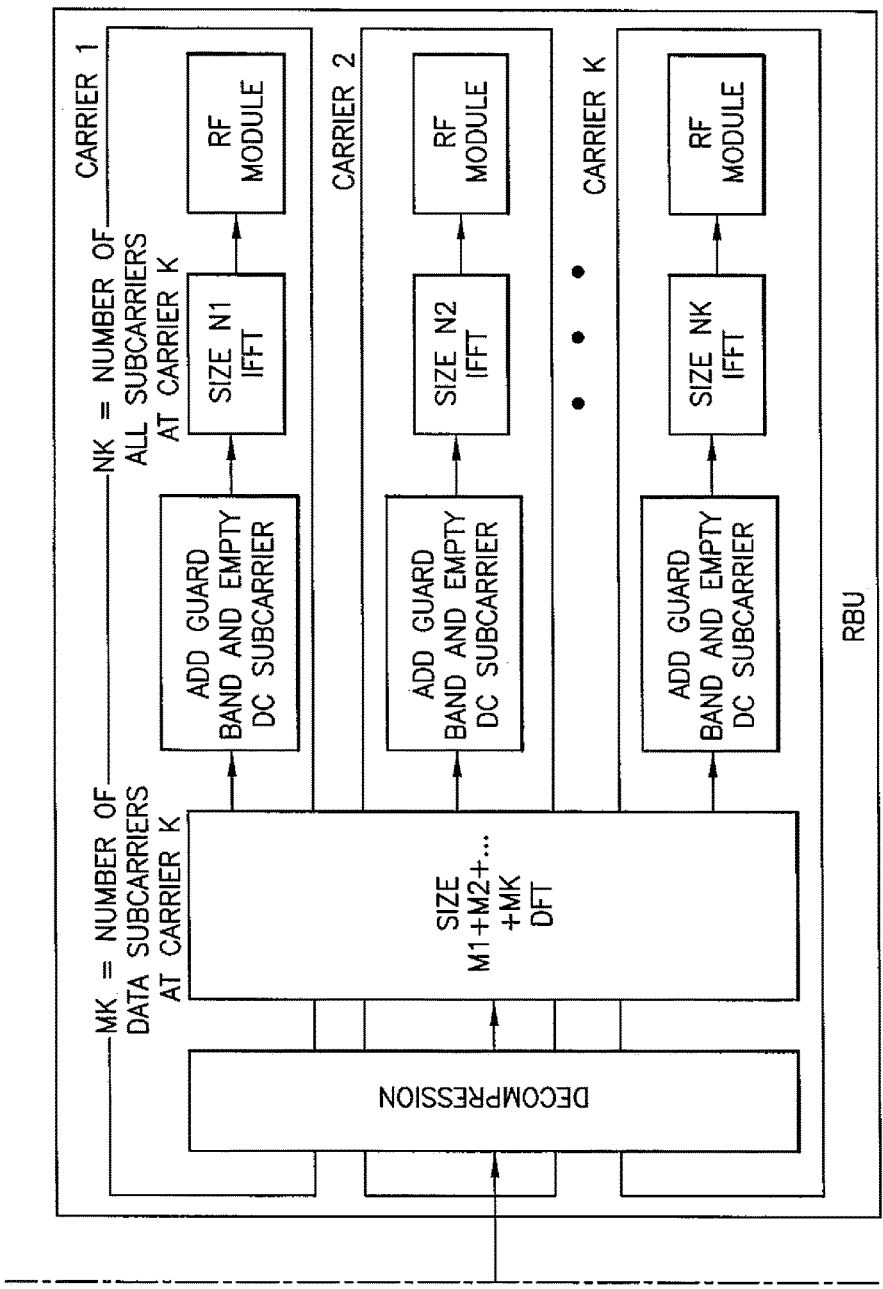

Another non-limiting exemplary embodiment may be used for multi-carrier transportation. A block diagram of multi-carrier system where IDFT spread is used is illustrated in FIG. 5.

Carrier 1 to Carrier k each has size M1, to Mk data subcarriers respectively, where M1, M2, . . . Mk don't have to be equal to each other. The total number of subcarriers for Carrier 1 to Carrier K are N1, N2, . . . Nk total subcarriers respectively. In accordance with a non-limiting exemplary embodiment, one can use a size M1+M2+ . . . Mk IDFT to spread the frequency domain data across multiple carriers before performing compression. At the remote RF unit, after decompression, a size M1+M2+ . . . +Mk DFT is performed to recover the data subcarriers for each individual carrier. Subsequently, at each carrier, after adding their respective guard and empty DC subcarriers, size N1, N2, . . . Nk IFFT is performed before the signal is sent to the RF module.

In accordance with a non-limiting exemplary embodiment, the frequency bandwidth may include a plurality of data subcarriers, and the frequency domain data spread among the plurality of carriers. After decompression data subcarriers may be recovered for each of the plurality of carriers.

Another embodiment of this invention is for a HUB where multi-hop fronthaul transportation becomes possible. A block diagram that illustrates an example with three carriers is illustrated in FIG. 6.

Figure 6B:
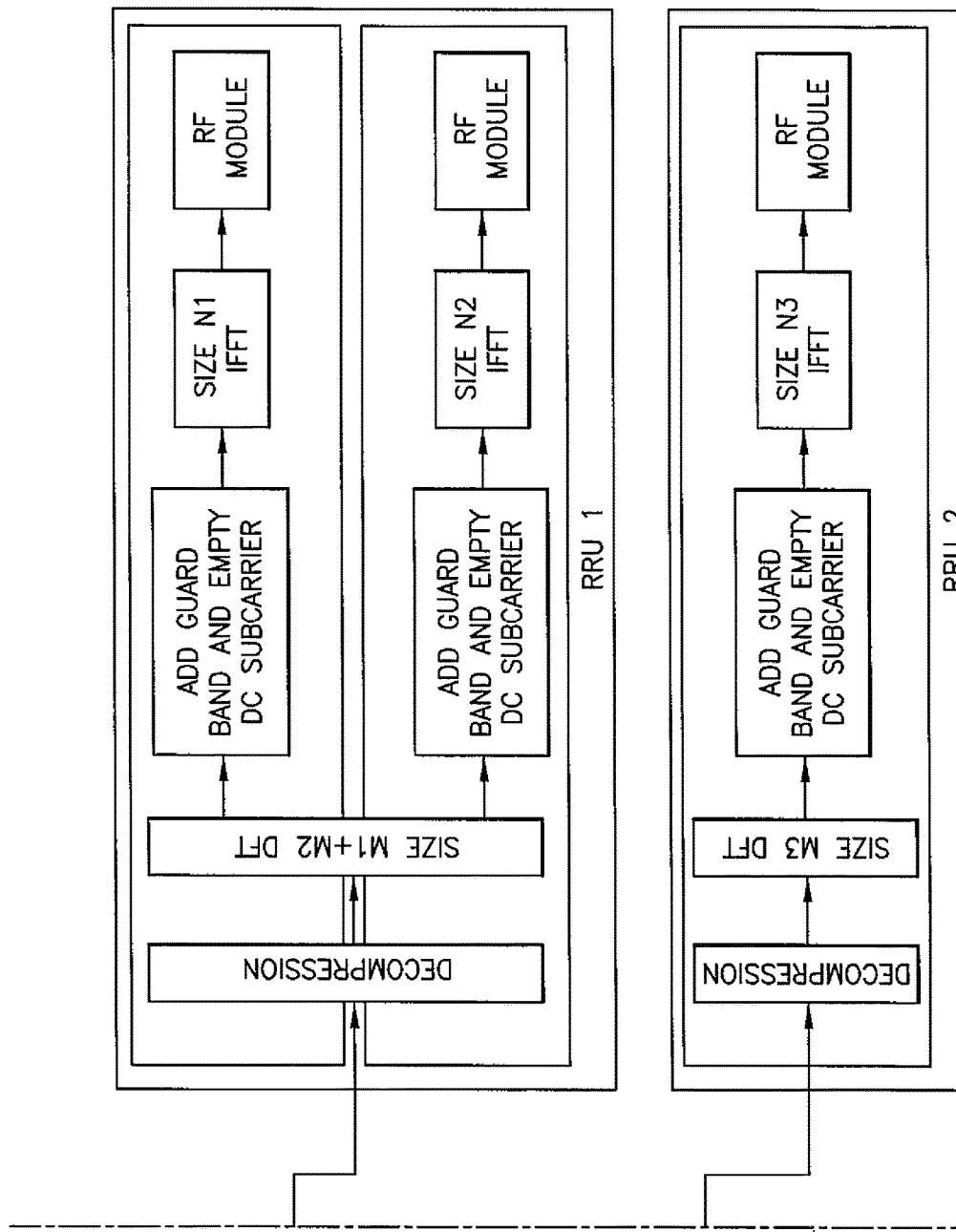

FIG. 6 shows an exemplary non-limiting embodiment of a hub that provides one hop in the fronthaul transportation. Using a method proposed in this embodiment, carrier 1, 2, 3's frequency domain data are aggregated together and sent towards the HUB, where the frequency domain data are recovered and repackaged into two separate streams for RU1 and RU2. This invention supports a plural number of hops.

Figure 7:
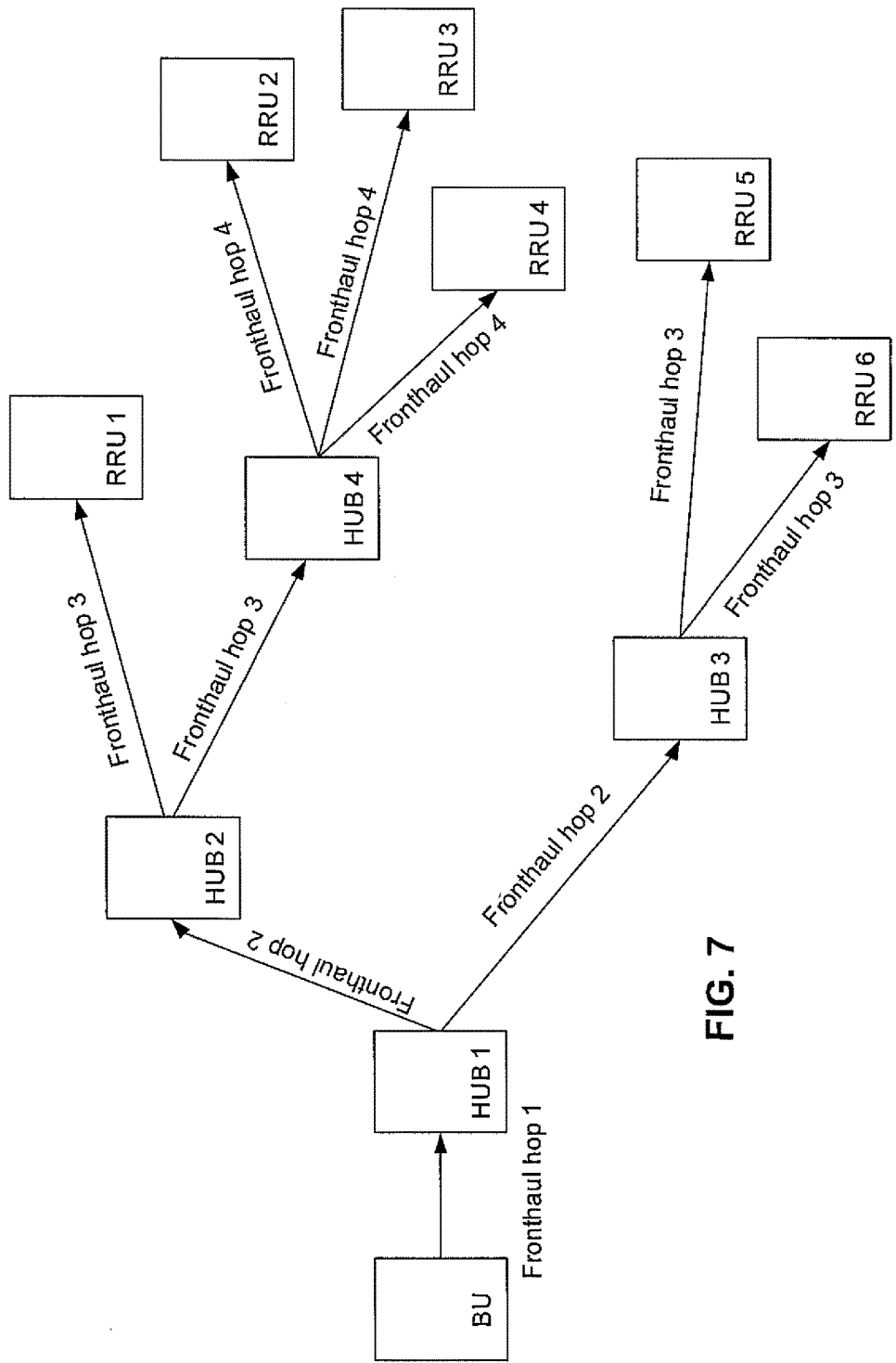
FIG. 7 is an exemplary network topology for a multi-hop fronthaul networks

FIG. 7 is an exemplary network topology for a multi-hop fronthaul networks showing that HUBs can be cascaded as the tree of data streams evolve. In accordance with a non-limiting exemplary embodiment, the frequency bandwidth includes a plurality of data subcarriers. The frequency domain data is spread among the plurality of carriers. The frequency domain data can be recovered and subsequently regrouped into subsets of carriers and re-spread within the subsets enabling a fronthaul split function where subsets of the plurality of carriers can connect with differently located remote radio units at different locations. This same scheme can be reuse to form a multi-hop fronthaul transportation. Accordingly, as shown in FIG. 7, multiple HUBs can be arranged in a hierarchical structure in a star topology to connect the frequency domain signal from the BU to the remote radio unit. For example, for the frequency domain data from the baseband unit to reach RRU3, it will take 4 fronthaul hops with 3 hubs (HUB1, HUB2 and HUB4). At each HUB, the input compressed time domain signal from the BU or upstream HUB is recovered and be split into a plural of time domain signals where IDFT is applied prior to each subset of data subcarriers.

Without in any way limiting the scope, interpretation, or application of the claims appearing below, technical effects of one or more of the example embodiments disclosed herein are:

1) Providing a solution to the performance degradation issue in conventional compression techniques where the compression is directly applied to the frequency domain data. As indicated previously, power control in the downlink control region, high order modulation and precoding, pilot/RB boosting, etc. greatly increase the dynamic range of the data and make the existing compression techniques less effective.

2) Within a lightly loaded cell, where there are un-used resource blocks, IDFT spread across the entire data subcarriers bandwidth can also allow used subcarriers' compression error "bleeds into" the unused data subcarriers, thus further reduce the dynamic range of the output signal. This allows the compression to be more efficient with fewer bits.

3) If IDFT spread is applied across several carriers, heavily loaded cells can "bleed" into lightly loaded carriers such that reduce the dynamic range of the heavily loaded cells. The net effect is that the compression is more bandwidth efficient.

4) The support of multi-hop multi-carrier transportation is available using the exemplary embodiments.

5) The exemplary embodiments may also be more acceptable into a standard for front haul transportation due to simplicity and scalability (for example, because FFT is already part of the LTE implementation). The exemplary embodiments do not require newer type of hardware accelerators and can be easily accepted by the standard body and equipment vendors.

Figure 8:
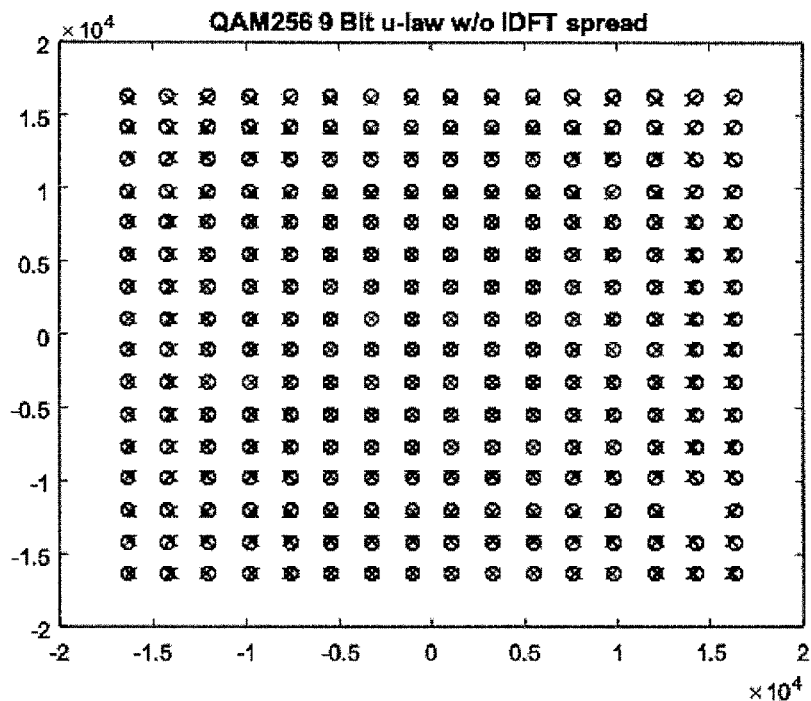
FIG. 8 illustrates a simulation case where EVM=0.87%.
Figure 9:
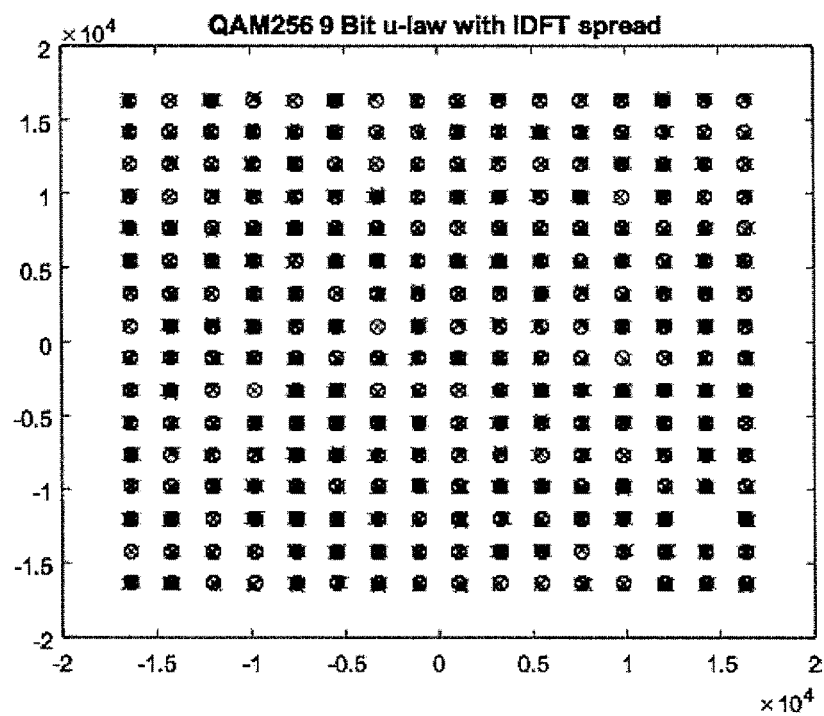
FIG. 9 illustrates a simulation case where EVM=0.64% and compares the EVM difference in FIG. 8 with 9 bit u-law compression without and with IDFT spread.
Figure 10:
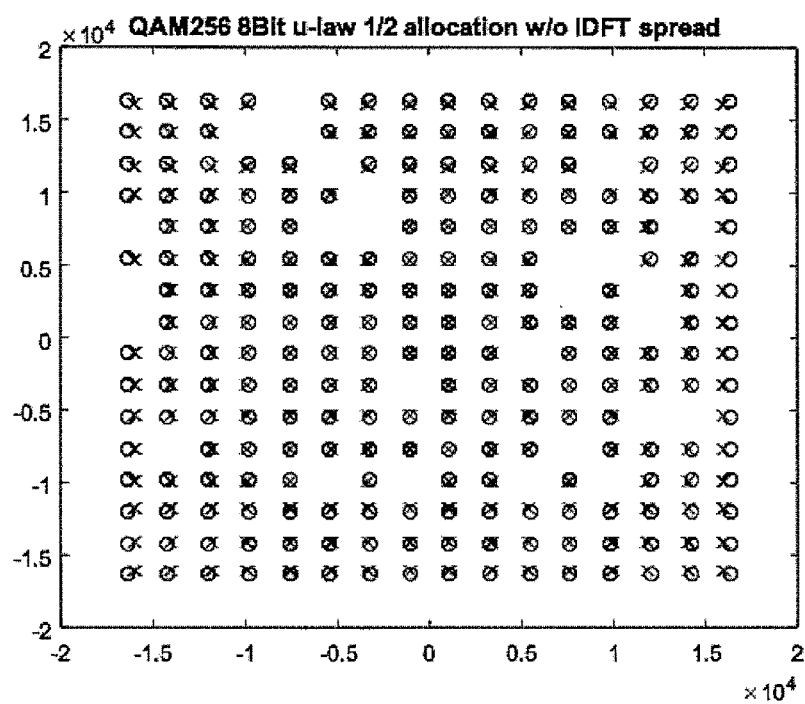
FIG. 10 illustrates a simulation case where EVM=1.53%.
Figure 11:
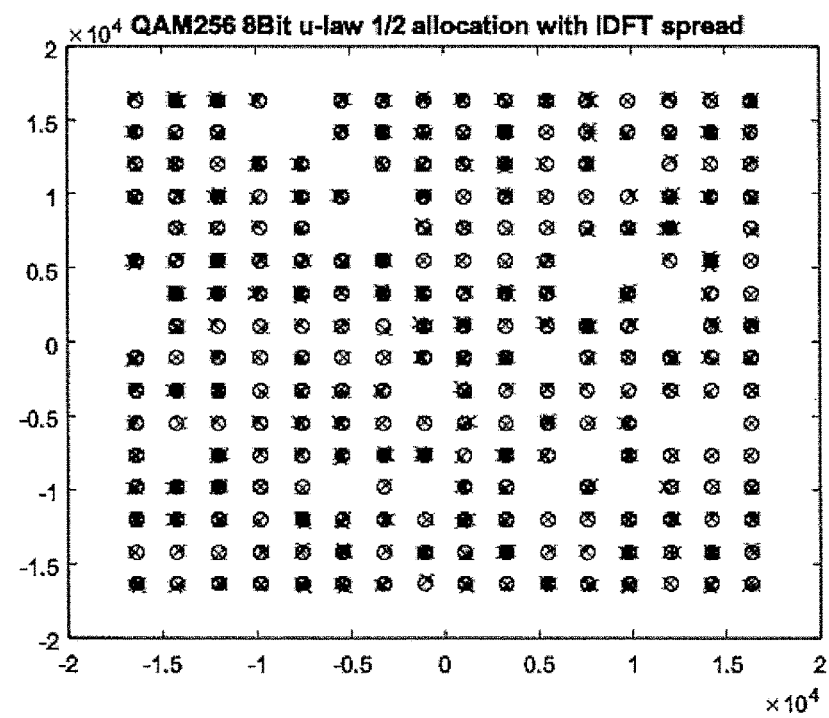
FIG. 11 illustrates a simulation case where EVM=0.89% and compares the EVM difference in FIG. 10 with 8 bit u-law compression without and with IDFT spread.

Simulation results for two test cases are summarized below:

1) Simulation case 1 (FIGS. 8 and 9) compares 15 bit to 9 bit u-law compression with all 1200 carriers as 256QAM test case. The result shows that with IDFT spread added before compression, the EVM of the recovered signal is 0.64%. Without doing the IDFT spread, the EVM of the recovered signal is 0.87%. Accordingly, this simulation shows the exemplary embodiments may provide about 1.3 dB (10 log(0.87%/0.64%)) improvement due to reduced dynamic range at the same compression ratio. (Note, in FIGS. 8-11 circles are the original frequency domain data and crosses are the recovered frequency domain data after compression).

2) Simulation case 2 (FIGS. 10 and 11) compares the case of lightly loaded cell with 600 carriers as 256QAM and other 600 carriers unallocated (zero power). The result shows that with IDFT spread added before compression, it is possible to achieve EVM of recovered signal at 0.89% with 15 bit to 8 bit compression. Without IDFT, at 15 to 8 bit compression, the EVM is 1.53% which leaves significantly less room for EVM contributions from other signal processing blocks, especially for higher order modulation schemes as 256 QAM. In both Simulation case 1 and Simulation case 2, EVM results are better with IDFT spread.

Embodiments herein may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted. A computer-readable medium may comprise a computer-readable storage medium that may be any media or means that can contain, store, and/or transport the instructions for use by or in connection with an instruction execution system, apparatus, or device, such as a computer. A computer-readable storage medium does not comprise propagating signals.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:
BU baseband unit
CPRI common public radio interface
DC Direct Current
DFT Discrete Fourier Transform
eNB (or eNodeB) evolved Node B (e.g., an LTE base station)
EVM error vector magnitude
IDFT Inverse Discrete Fourier Transform
I/F interface
IOT Internet of Things
LTE long term evolution
LTE-A LTE Advanced
LTE-M LTE for Machine Type Communications
OBSAI open base station architecture initiative
MME mobility management entity
NCE network control element
N/W network
RRH remote radio head
Rx receiver
SGW serving gateway
Tx transmitter
UE user equipment (e.g., a wireless, typically mobile device)

What is claimed is:

1. A method, comprising:
applying Inverse Discrete Fourier Transform to frequency domain data contained in a frequency bandwidth to generate a time domain output signal in a time domain, wherein the Inverse Discrete Fourier Transform is applied on the frequency domain data over the entire frequency bandwidth, with the exception of guard bands and direct current carriers;

compressing the time domain output signal to generate a compressed time domain output signal; and transmitting the compressed time domain output signal over a fronthaul interface to a remote unit, where the compressed time domain output signal is decompressable at the remote unit to generate a decompressed time domain output signal, and where applying Discrete Fourier Transform to the decompressed time domain output signal at the remote unit recovers the frequency domain data, wherein the time domain output signal contains a real part and an imaginary part, and further comprises separately scaling the real part and the imaginary part, and wherein a real part dynamic range of the real part is different than an imaginary part dynamic range of the imaginary part, and wherein the method further comprises applying a real part scaling factor to the real part and an imaginary part scaling factor to the imaginary part prior to compressing the time domain output signal.

2. The method of claim 1, wherein the fronthaul interface includes one of an Ethernet, extended CPRI or OBSAI connection for transmitting the compressed time domain output signal.

3. The method of claim 1, further comprising:
augmenting the frequency domain data with a guard band at each edge of the frequency bandwidth and an empty direct current carrier after decompressing the compressed time domain output signal.

4. The method of claim 3, wherein the empty direct current carrier is located substantially at a middle of the frequency bandwidth.

5. The method of claim 3, wherein a cyclic prefix is inserted in the compressed time domain output signal before transmitting.

6. The method of claim 1, wherein the real part scaling factor and the imaginary part scaling factor are constants transmitted as one of in-band transmissions of the compressed time domain output signal and out-of-band transmissions in a packet header field.

7. The method of claim 1, wherein after decompressing, an inverse of the real part scaling factor and an inverse of the imaginary scaling factor are applied to restore the real part dynamic range of the real part and the imaginary part dynamic range of the imaginary part in the recovered frequency domain data.

8. The method of claim 1, further comprising:
determining a dynamic range reduction due to the application of the Inverse Discrete Fourier Transform to frequency domain data; and selecting a compression ratio of the compressed time domain output signal dependent on the dynamic range reduction.

9. The method of claim 1, wherein the frequency bandwidth includes a plurality of data subcarriers, and wherein the frequency domain data is spread among the plurality of carriers.

10. The method of claim 9, wherein after decompression data subcarriers are recovered for each of the plurality of carriers.

11. The method of claim 1, wherein the frequency bandwidth includes a plurality of data subcarriers, and wherein the frequency domain data is spread among the plurality of carriers, whereby the frequency domain data can be recovered and subsequently regrouped into subsets of carriers and re-spread within the subsets enabling a fronthaul split function where subsets of the plurality of carriers can connect with differently located remote radio units at different locations.

12. A method, comprising:
receiving a compressed time domain output signal, where the compressed time domain output signal is generated by applying Inverse Discrete Fourier Transform to frequency domain data contained in a frequency bandwidth to generate a time domain output signal in a time domain, and compressing the time domain output signal, wherein the time domain output signal contains a real part and an imaginary part, wherein a real part dynamic range of the real part is different than an imaginary part dynamic range of the imaginary part, and wherein the real part is scaled by a real part scaling factor and the imaginary part is scaled by an imaginary part scaling factor prior to the time domain output signal being compressed, wherein the Inverse Discrete Fourier Transform is applied on the frequency domain data over the entire frequency bandwidth, with the exception of guard bands and direct current carriers;

decompressing the compressed time domain output signal; and applying Discrete Fourier Transform to the decompressed time domain output signal to recover the frequency domain data.

13. The method of claim 12, wherein the fronthaul interface includes one of an Ethernet, extended CPRI or OBSAI connection for transmitting the compressed time domain output signal.

14. The method of claim 12, wherein the frequency domain data is augmented with a guard band at each edge of the frequency bandwidth and an empty direct current carrier after decompressing the compressed time domain output signal.

15. The method of claim 14, wherein the empty direct current carrier is located substantially at a middle of the frequency bandwidth.

16. An apparatus, comprising:
at least one processor; and
at least one non-transitory memory including computer program code,
the at least one memory and the computer program code configured to, with the at least one processor, cause the apparatus to at least:
apply Inverse Discrete Fourier Transform to frequency domain data contained in a frequency bandwidth to generate a time domain output signal in a time domain, wherein the Inverse Discrete Fourier Transform is applied on the frequency domain data over the entire frequency bandwidth, with the exception of guard bands and direct current carriers;
compress the time domain output signal to generate a compressed time domain output signal;
transmit the compressed time domain output signal over a fronthaul interface to a remote unit, where the compressed time domain output signal is decompressable at the remote unit to generate a decompressed time domain output signal, and where applying Discrete Fourier Transform to the decompressed time domain output signal at the remote unit recovers the frequency domain data, wherein the time domain output signal contains a real part and an imaginary part, and wherein the apparatus is further caused to separately scale the real part and the imaginary part, and wherein a real part dynamic range of the real part is different than an imaginary part dynamic range of the imaginary part, and wherein the apparatus is further caused to: apply a real part scaling factor to the real part and an imaginary part scaling factor to the imaginary part prior to compression of the time domain output signal.

\* \* \* \* \*

UNITED STATES PATENT AND TRADEMARK OFFICE
CERTIFICATE OF CORRECTION

PATENT NO. : 10,135,599 B2
APPLICATION NO. : 15/229834
DATED : November 20, 2018
INVENTOR(S) : Gunter Wolff et al.

Page 1 of 1

It is certified that error appears in the above-identified patent and that said Letters Patent is hereby corrected as shown below:

In the Claims

In Claim 6:
Column 11, Line 43, "cornpressed" should be deleted and -- compressed -- should be inserted.

Signed and Sealed this
Fifteenth Day of January, 2019

Andrei Iancu
*Director of the United States Patent and Trademark Office*